United States Patent
Xiang et al.

(10) Patent No.: US 11,764,732 B2
(45) Date of Patent: Sep. 19, 2023

(54) HIGH-SPEED HIGH-LINEARITY TIME-INTERLEAVED DYNAMIC OPERATIONAL AMPLIFIER CIRCUIT

(71) Applicant: Chengdu Sino Microelectronics Technology Co., Ltd., Chengdu (CN)

(72) Inventors: Feixiang Xiang, Chengdu (CN); Yuanjun Cen, Chengdu (CN)

(73) Assignee: CHENGDU SINO MICROELECTRONICS TECHNOLOGY CO., LTD., Chengdu (CN)

( * ) Notice: Subject to any disclaimer, the term of this patent is extended or adjusted under 35 U.S.C. 154(b) by 240 days.

(21) Appl. No.: 17/386,571

(22) Filed: Jul. 28, 2021

(65) Prior Publication Data

US 2022/0131502 A1    Apr. 28, 2022

(30) Foreign Application Priority Data

Oct. 26, 2020 (CN) .......................... 202011152637.4

(51) Int. Cl.
*H03F 1/02*   (2006.01)
*H03M 1/06*   (2006.01)
*H03F 3/45*   (2006.01)

(52) U.S. Cl.
CPC ........ *H03F 1/0211* (2013.01); *H03M 1/0612* (2013.01)

(58) Field of Classification Search
CPC .. H03F 1/0211; H03F 3/2173; H03F 3/45179; H03M 1/0612; H03M 1/1215; H03M 1/124

USPC ......................................... 330/252–261, 250
See application file for complete search history.

(56) References Cited

U.S. PATENT DOCUMENTS

| | | | |
|---|---|---|---|
| 10,411,707 B1* | 9/2019 | Lee ...................... | H03F 3/45183 |
| 2005/0156667 A1* | 7/2005 | Cho .................... | H03F 3/45179 |
| | | | 330/260 |
| 2006/0012429 A1* | 1/2006 | Kim .................... | H03F 3/45188 |
| | | | 330/253 |
| 2022/0376685 A1* | 11/2022 | Chen .................... | H03K 5/2481 |

* cited by examiner

*Primary Examiner* — Hieu P Nguyen
(74) *Attorney, Agent, or Firm* — Bayramoglu Law Offices LLC

(57) ABSTRACT

A high-speed high-linearity time-interleaved dynamic operational amplifier circuit includes a first current channel and a second current channel. The first current channel includes a first MOS transistor, a second MOS transistor and a third MOS transistor which are sequentially connected in series between a high level and a ground level. The first MOS transistor and the second MOS transistor have opposite conductivity types. A control end of the first MOS transistor is connected to a control end of the second MOS transistor. The second current channel includes a fourth MOS transistor, a fifth MOS transistor and a sixth MOS transistor which are sequentially connected in series between the high level and the ground level. The fourth MOS transistor and the fifth MOS transistor have opposite conductivity types. A control end of the fourth MOS transistor is connected to a control end of the fifth MOS transistor.

2 Claims, 2 Drawing Sheets

U.S. 11,764,732 B2

HIGH-SPEED HIGH-LINEARITY TIME-INTERLEAVED DYNAMIC OPERATIONAL AMPLIFIER CIRCUIT

CROSS REFERENCE TO THE RELATED APPLICATIONS

This application is based upon and claims priority to Chinese Patent Application No. 202011152637.4, filed on Oct. 26, 2020, the entire contents of which are incorporated herein by reference.

TECHNICAL FIELD

The present invention relates to an integrated circuit technology.

BACKGROUND

The circuit is specifically applied to an analog front end (AFE) of an ultrahigh-speed ADC (analog-to-digital converter) circuit. In the design of the ultrahigh-speed ADC circuit, it is necessary to isolate an input sampling signal of an analog front end module by an output buffer circuit and amplify the input sampling signal to drive a next level of ADC circuit. Compared with existing circuits of the same type, the output buffer circuit according to the present invention increases an important index in an input sampling circuit: spurious free dynamic range (SFDR). In an existing ultrahigh-speed ADC, the SFDR of the ADC analog front end of 20 GHz or higher is about 40 dB to 50 dB, but a dynamic operational amplifier circuit of this design circuit enables the SFDR of the analog front end to reach 55 dB or higher.

FIG. 1 shows an input structure of a traditional time-interleaved ADC circuit, having architecture that input signals Vi are accurately sampled from the first level of four channels phi1_3 to phi1_0, and then the sampled signals are distributed to a capacitor Cs by the second level of clocks phi2_15 to phi2_0 to acquire a sampled signal Vn. The performance indexes about SFDR which the present invention relates to are based on the signal Vn. A voltage value of Vn is easily affected by input wiring and a switch parasitic capacitance charge clock, and is also easily affected by dynamic operational amplifier input parasitic capacitance. It is particularly important that nonlinear capacitance and charge introduced by the dynamic operational amplifier are generally the main factors because it is necessary to drive heavy current.

The second prior art is a structure similar to a phase inverter. Referring to FIG. 2, a switch Q7 and a switch Q8 are used for switching at different stages of sampling and holding so as to reset an output signal Vsample to a common mode level while the input signal is sampled at the sampling stage, thus facilitating a next driving amplification.

The prior art mainly has the following two disadvantages: 1. Due to the two stages of amplification and reset, an input transistor Q5 and an input transistor Q6 are in different working states (during amplification, the Q7 and the Q8 are turned on and the Q5 and the Q6 work in a saturated region; and during reset, the Q7 and the Q8 are turned off, and the Q5 and the Q6 work in a cut-off region), resulting in great deviation of the parasitic capacitance of the input transistor, thereby greatly affecting the stability of the sum of the sampling capacitor Cs and the parasitic capacitance and further deteriorating the SFDR; and 2. due to the use of the switch structure, the current of an amplifying branch is turned off and on and the clock charge is coupled to the sampling capacitor Cs, and the sampling signal will also be deteriorated.

SUMMARY

The technical problem to be solved by the present invention is to provide a dynamic operational amplifier circuit so as to reduce a sampling capacitor Cs and parasitic capacitance on a node route of the sampling capacitor Cs, thereby stabilizing the parasitic capacitance on input wiring during sampling.

In order to solve the technical problem, the present invention adopts the following technical solution: a high-speed high-linearity time-interleaved dynamic operational amplifier circuit includes:

a first current channel, including a first MOS transistor, a second MOS transistor and a third MOS transistor which are sequentially connected in series between a high level and a ground level, the first MOS transistor and the second MOS transistor having opposite conductivity types, and a control end of the first MOS transistor being connected to a control end of the second MOS transistor;

a second current channel, including a fourth MOS transistor, a fifth MOS transistor and a sixth MOS transistor which are sequentially connected in series between the high level and the ground level, the fourth MOS transistor and the fifth MOS transistor having opposite conductivity types, and a control end of the fourth MOS transistor being connected to a control end of the fifth MOS transistor, wherein the first MOS transistor and the fourth MOS transistor have the same conductivity type;

a current output end of the first MOS transistor and a current output end of the fourth MOS transistor form a pair of differential output ends;

the control end of the first MOS transistor and the control end of the fourth MOS transistor form a pair of differential input ends;

a control end of a seventh MOS transistor is connected to the control end of the first MOS transistor, a current input end of the seventh MOS transistor is connected to the current output end of the fourth MOS transistor, a current output end of the seventh MOS transistor is connected to a current input end of an eighth MOS transistor, and a current output end of the eighth MOS transistor is grounded;

a control end of a ninth MOS transistor is connected to the control end of the fourth MOS transistor, a current input end of the ninth MOS transistor is connected to the current output end of the first MOS transistor, a current output end of the ninth MOS transistor is connected to a current input end of a tenth MOS transistor, and a current output end of the tenth MOS transistor is grounded; and a control end of the eighth MOS transistor and a control end of the tenth MOS transistor are connected at a positive phase clock input point CKP, and a control end of the third MOS transistor and a control end of the sixth MOS transistor are connected at a negative phase clock input point CKN.

The current output end of the seventh MOS transistor is connected to the current output end of the ninth MOS transistor, a current output end of the second MOS transistor is connected to a current output end of the fifth MOS transistor, and a capacitor is arranged between the current output end of the seventh MOS transistor and the current output end of the second MOS transistor.

The first MOS transistor and the fourth MOS transistor are PMOS transistors; and the second MOS transistor, the third MOS transistor, the fifth MOS transistor, the sixth MOS transistor, the seventh MOS transistor, the eighth MOS transistor, the ninth MOS transistor and the tenth MOS transistor are NMOS transistors.

According to the present invention, the circuit structure is improved, and the linearity of the sampling link of the ultrahigh-speed ADC circuit is greatly improved, mainly in an aspect of the SFDR, thus providing possibility for the research and development of the ADC with higher precision.

DETAILED DESCRIPTION OF THE EMBODIMENTS

Figure 1:
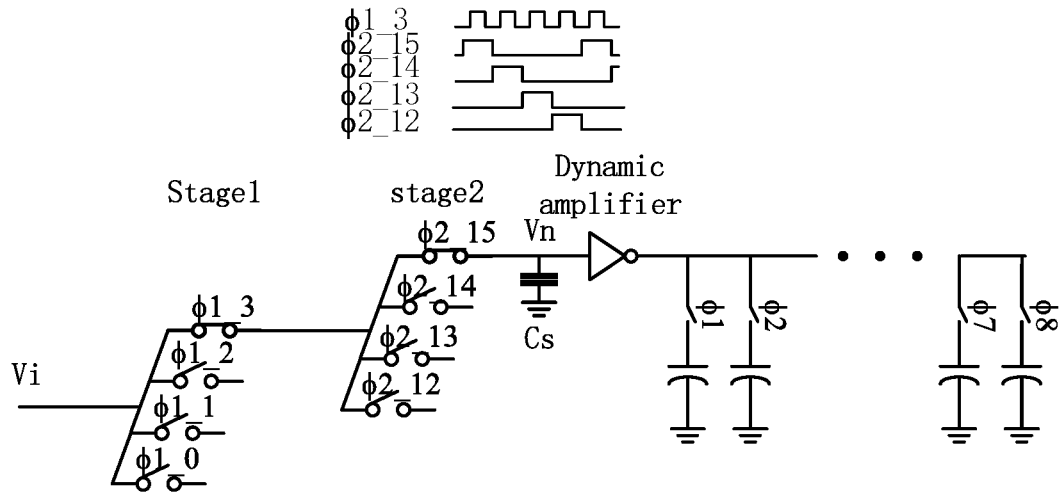
FIG. 1 is a schematic diagram of a first prior art.
Figure 2:
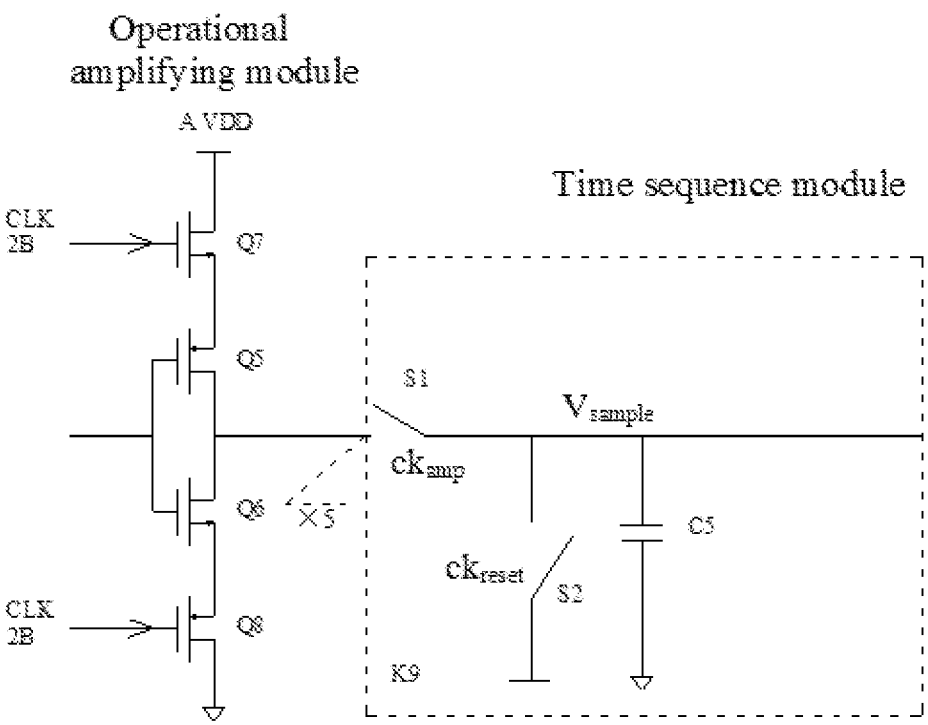
FIG. 2 is a schematic diagram of a second prior art.

In this specification, a port of an MOS transistor is expressed by a current direction. For a PMOS transistor, a current input end refers to a source end, a current output end refers to a drain end, and a control end refers to a gate end; and for an NMOS transistor, a current input end refers to a drain end, a current output end refers to a source end, and a control end refers to a gate end. This is clear to a person of ordinary skill in the art.

In this specification, the "conductivity type" refers to a P type or an N type. The P type MOS transistor and the N type MOS transistor are called as two kinds of MOS transistors with opposite conductivity types.

A high-speed high-linearity time-interleaved dynamic operational amplifier circuit, comprising:

a first current channel, comprising a first MOS transistor 301, a second MOS transistor 302 and a third MOS transistor 303 which are sequentially connected in series between a high level and a ground level, the first MOS transistor 301 and the second MOS transistor 302 having opposite conductivity types, and a control end of the first MOS transistor 301 being connected to a control end of the second MOS transistor 302;

a second current channel, comprising a fourth MOS transistor 304, a fifth MOS transistor 305 and a sixth MOS transistor 306 which are sequentially connected in series between the high level and the ground level, the fourth MOS transistor 304 and the fifth MOS transistor 305 having opposite conductivity types, and a control end of the fourth MOS transistor 304 being connected to a control end of the fifth MOS transistor 305, wherein the first MOS transistor 301 and the fourth MOS transistor 304 have the same conductivity type;

a current output end of the first MOS transistor 301 and a current output end of the fourth MOS transistor 304 form a pair of differential output ends;

the control end of the first MOS transistor 301 and the control end of the fourth MOS transistor 304 form a pair of differential input ends;

a control end of a seventh MOS transistor 307 is connected to the control end of the first MOS transistor 301, a current input end of the seventh MOS transistor 307 is connected to the current output end of the fourth MOS transistor 304, a current output end of the seventh MOS transistor 307 is connected to a current input end of an eighth MOS transistor 308, and a current output end of the eighth MOS transistor 308 is grounded;

a control end of a ninth MOS transistor 309 is connected to the control end of the fourth MOS transistor 304, a current input end of the ninth MOS transistor 309 is connected to the current output end of the first MOS transistor 301, a current output end of the ninth MOS transistor 309 is connected to a current input end of a tenth MOS transistor 310, and a current output end of the tenth MOS transistor 310 is grounded;

a control end of the eighth MOS transistor 308 and a control end of the tenth MOS transistor 310 are connected at a positive phase clock input point CKP, and a control end of the third MOS transistor 303 and a control end of the sixth MOS transistor 306 are connected at a negative phase clock input point CKN;

a capacitor is arranged between the current output end of the seventh MOS transistor 307 and the current output end of the second MOS transistor 302.

The first MOS transistor 301 and the fourth MOS transistor 304 are PMOS transistors; and the second MOS transistor 302, the third MOS transistor 303, the fifth MOS transistor 305, the sixth MOS transistor 306, the seventh MOS transistor 307, the eighth MOS transistor 308, the ninth MOS transistor 309 and the tenth MOS transistor 310 are NMOS transistors.

Figure 3:
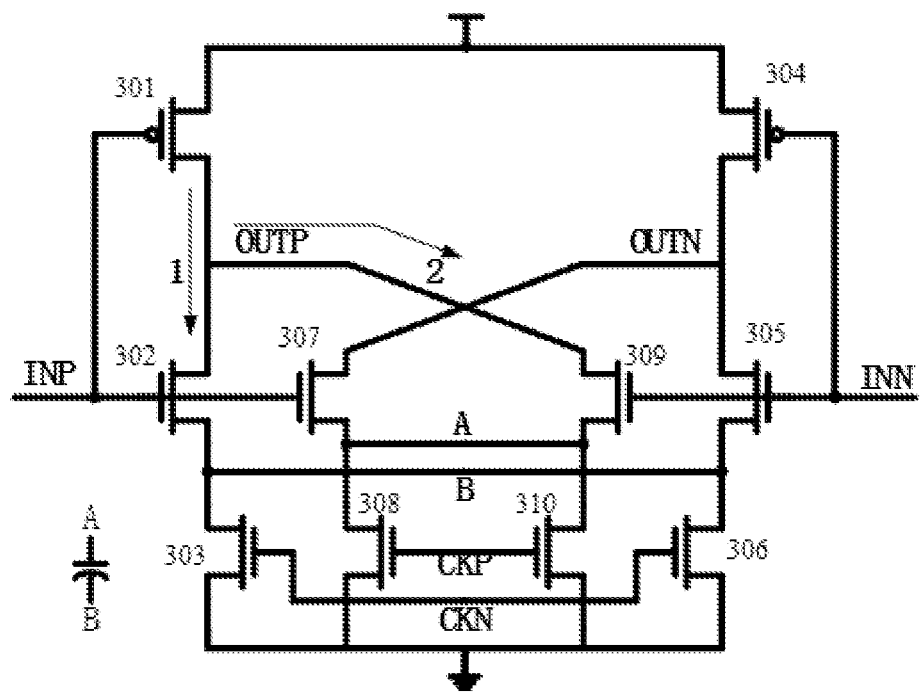
FIG. 3 is a circuit diagram of the present invention.

FIG. 3 is an embodiment of the present invention. A first MOS transistor and a fourth MOS transistor are PMOS transistors; and a second MOS transistor, a third MOS transistor, a fifth MOS transistor, a sixth MOS transistor, a seventh MOS transistor, an eighth MOS transistor, a ninth MOS transistor and a tenth MOS transistor are NMOS transistors.

In a reset stage, a CKN is turned off, a CKP is turned on, and an output current flows out from a channel 2. Since INP and INN are differential input signals, the PMOS transistor current driven by the INP and the NMOS transistor current driven by the INN have opposite phases and are counteracted after combination, and only direct current information is remained, such that the purpose of reset is achieved. During amplification, the CKP is turned off, the CKN is turned on, the current flows out from a channel 1, and the current works in a phase inverter state.

Since the main factor for ensuring the SFDR performance of an analog front end circuit is the stability of the sum of a sampling capacitor Cs and parasitic capacitance thereof, which is not affected by an input voltage and switching between sampling and holding stages, and the Cs is most easily affected by a dynamic operational amplifier which deteriorates the capacitance value of the Cs. The purpose of the present invention is to reduce the influence on the Cs by the dynamic operational amplifier.

Figure 4:
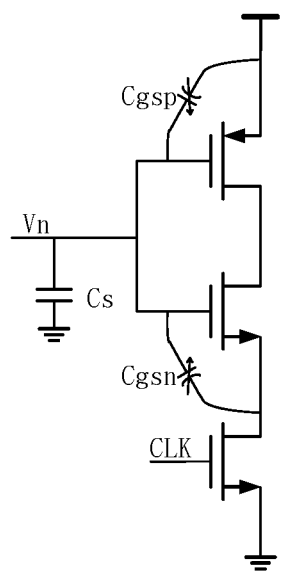
FIG. 4 is a schematic diagram of a single channel of the present invention.

Referring to FIG. 4, Vn is an input voltage after sampling and is stored in a Cs-dominated capacitor in a form of charge. The capacitor mainly includes Cs, Cgsp and Cgsn, wherein the Cgsp and the Cgsn are gate-source parasitic capacitors of PMOS and NMOS; and the capacitance values of the Cgsp and the Cgsn are affected by the state of the MOS transistor and the input voltage, such that the linearity of the circuit is seriously affected. Assuming that the capacitance of a node where the Vn is located is Ctot=Cs+Cgsp+Cgsn, then the size and change degree of Cgs=Cgsp+Cgsn directly affect Ctot. Since an existence form of the Vn is maintained by the charge Qn, and the voltage Vn=Qn/Ctot, the change of the Ctot directly affects the linearity of the Vn, and further affects driving amplification of a next level.

In the present invention, since the channel 1 and the channel 2 are conducted alternately, the Cgsp is always in a saturated region and the capacitance value is relatively stable. The Cgsn of the NMOS is turned on and off alternately in the channel 1 and the channel 2, but a total value is stable, such that a stable capacitance value may be ensured. Moreover, the Cgs has a certain nonlinearity even if the MOS transistor works in the saturated region, the value of the Cgs is affected by Vgs (a gate-source voltage), and the change directions of the PMOS and the NMOS are opposite, so the change may be counteracted by adjusting the size of the PMOS and the NMOS and the stability of the capacitor is improved. In FIG. 3, a capacitor between two points A and B is added to form a high-pass channel for counteracting switch charge coupling during switching between the CKP and the CKN, thereby preventing the charge of the CLK from being transferred to the Vn through a Cgd (a gate-drain capacitor) and a Cgsn channel of the switch and avoiding the influence on the charge value of the Ctot.

Compared with existing circuits of the same type, the output buffer circuit according to the present invention increases an important index in an input sampling circuit: spurious free dynamic range (SFDR). In an existing ultra-high-speed ADC, the SFDR of the ADC analog front end of 20 GHz or higher is about 40 dB to 50 dB, but a dynamic operational amplifier circuit of this design circuit enables the SFDR of the analog front end to reach 55 dB or higher.

The circuit provided by the present invention is at an ultrahigh-speed part of a chip input stage in a chip. The chip generally adopts ultrahigh-speed sampling, the input signal of the circuit is extremely fast, the sampling clock is extremely high, and the irrational subtle change in this part of circuit directly restricts the performance of the chip. Therefore, many companies optimize the AFE part. In the existing ultrahigh-speed ADC design, the input circuit architectures are basically similar, but in order to improve indexes such as the SFDR, the companies have specifically optimized the dynamic operational amplifier circuit and other circuits. According to the results of the existing chips, when the input signal is greater than 20 GHz, the SDFR of the chip will drop to about 40 dB. Compared with the existing chips, the present invention directly increases the SFDR to 55 dB or higher.

What is claimed is:

1. A high-speed high-linearity time-interleaved dynamic operational amplifier circuit, comprising:
  a first current channel and a second current channel; wherein
  the first current channel comprises a first metal oxide semiconductor (MOS) transistor, a second MOS transistor and a third MOS transistor, wherein
    the first MOS transistor, the second MOS transistor and the third MOS transistor are sequentially connected in series between a high level and a ground level,
    the first MOS transistor and the second MOS transistor have opposite conductivity types, and
    a control end of the first MOS transistor is connected to a control end of the second MOS transistor;
  the second current channel comprises a fourth MOS transistor, a fifth MOS transistor and a sixth MOS transistor, wherein
    the fourth MOS transistor, the fifth MOS transistor and the sixth MOS transistor are sequentially connected in series between the high level and the ground level,
    the fourth MOS transistor and the fifth MOS transistor have opposite conductivity types, and
    a control end of the fourth MOS transistor is connected to a control end of the fifth MOS transistor, wherein the first MOS transistor and the fourth MOS transistor have a same conductivity type;
  a current output end of the first MOS transistor and a current output end of the fourth MOS transistor form a pair of differential output ends;
  the control end of the first MOS transistor and the control end of the fourth MOS transistor form a pair of differential input ends;
  a control end of a seventh MOS transistor is connected to the control end of the first MOS transistor,
  a current input end of the seventh MOS transistor is connected to the current output end of the fourth MOS transistor,
  a current output end of the seventh MOS transistor is connected to a current input end of an eighth MOS transistor, and
  a current output end of the eighth MOS transistor is grounded;
  a control end of a ninth MOS transistor is connected to the control end of the fourth MOS transistor,
  a current input end of the ninth MOS transistor is connected to the current output end of the first MOS transistor,
  a current output end of the ninth MOS transistor is connected to a current input end of a tenth MOS transistor, and
  a current output end of the tenth MOS transistor is grounded;
  a control end of the eighth MOS transistor and a control end of the tenth MOS transistor are connected at a positive phase clock input point, and
  a control end of the third MOS transistor and a control end of the sixth MOS transistor are connected at a negative phase clock input point; and
  the current output end of the seventh MOS transistor is connected to the current output end of the ninth MOS transistor,
  a current output end of the second MOS transistor is connected to a current output end of the fifth MOS transistor, and
  a capacitor is arranged between the current output end of the seventh MOS transistor and the current output end of the second MOS transistor.

2. The high-speed high-linearity time-interleaved dynamic operational amplifier circuit according to claim 1, wherein
  the first MOS transistor and the fourth MOS transistor are P-channel metal oxide semiconductor (PMOS) transistors; and
  the second MOS transistor, the third MOS transistor, the fifth MOS transistor, the sixth MOS transistor, the seventh MOS transistor, the eighth MOS transistor, the ninth MOS transistor and the tenth MOS transistor are N-channel metal oxide semiconductor (NMOS) transistors.

* * * * *